(12) United States Patent
Jung et al.

(10) Patent No.: US 10,546,977 B2
(45) Date of Patent: *Jan. 28, 2020

(54) LIGHT EMITTING DEVICE, LIGHT EMITTING DEVICE PACKAGE INCLUDING THE DEVICE, AND LIGHTING APPARATUS INCLUDING THE PACKAGE

(71) Applicant: LG INNOTEK CO., LTD., Seoul (KR)

(72) Inventors: Sung Ho Jung, Seoul (KR); Jin Kyung Choi, Seoul (KR); Sang Youl Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/362,166

(22) Filed: Mar. 22, 2019

(65) Prior Publication Data

US 2019/0221714 A1 Jul. 18, 2019

Related U.S. Application Data

(63) Continuation of application No. 15/561,415, filed as application No. PCT/KR2016/002713 on Mar. 17, 2016, now Pat. No. 10,326,056.

(30) Foreign Application Priority Data

Mar. 26, 2015 (KR) .......................... 10-2015-0042677

(51) Int. Cl.
*H01L 33/40* (2010.01)
*H01L 33/46* (2010.01)
(Continued)

(52) U.S. Cl.
CPC .......... *H01L 33/405* (2013.01); *H01L 33/382* (2013.01); *H01L 33/42* (2013.01);
(Continued)

(58) Field of Classification Search
CPC ..... H01L 33/405; H01L 33/382; H01L 33/44; H01L 33/46; H01L 2933/0016; H01L 33/0025; H01L 33/32; H01L 33/42–62
See application file for complete search history.

(56) References Cited

U.S. PATENT DOCUMENTS

| 7,095,061 B2 | 8/2006 | Steigerwald et al. |
| 8,368,100 B2 | 2/2013 | Donofrio et al. |
(Continued)

FOREIGN PATENT DOCUMENTS

| JP | 2005-19939 A | 1/2005 |
| JP | 2008-16629 A | 1/2008 |
(Continued)

OTHER PUBLICATIONS

International Search Report for PCT/KR2016/002713 (PCT/ISA/210) dated Jun. 15, 2016.

*Primary Examiner* — Thanh T Nguyen
(74) *Attorney, Agent, or Firm* — Birch, Stewart, Kolasch & Birch, LLP

(57) ABSTRACT

A light emitting device includes a sapphire substrate; a light emitting structure disposed on the sapphire substrate, and including a first conductivity type semiconductor layer, a second conductivity type semiconductor layer, and an active layer disposed between the first conductivity type semiconductor layer and the second conductivity type semiconductor layer; a first electrode electrically connected to the first conductivity type semiconductor layer; a second electrode electrically connected to the second conductivity type semiconductor layer; a first bonding pad electrically connected to the first electrode; a second bonding pad electrically connected to the second electrode; a first insulation layer disposed on the light emitting structure; and a second insulation layer disposed between the second electrode and the second bonding pad.

20 Claims, 7 Drawing Sheets

(51) Int. Cl.
- *H01L 33/62* (2010.01)
- *H01L 33/38* (2010.01)
- *H01L 33/42* (2010.01)
- *H01L 33/44* (2010.01)
- H01L 33/00 (2010.01)
- H01L 33/32 (2010.01)

(52) U.S. Cl.
CPC .............. *H01L 33/44* (2013.01); *H01L 33/46* (2013.01); *H01L 33/62* (2013.01); *H01L 33/0025* (2013.01); *H01L 33/32* (2013.01); *H01L 2933/0016* (2013.01)

(56) References Cited

U.S. PATENT DOCUMENTS

| | | | |
|---|---|---|---|
| 8,476,644 | B2 | 7/2013 | Illek et al. |
| 9,293,664 | B2 | 3/2016 | Seo et al. |
| 2004/0256631 | A1 | 12/2004 | Shin |
| 2006/0273335 | A1 | 12/2006 | Asahara et al. |
| 2012/0286240 | A1 | 11/2012 | Yu et al. |
| 2013/0049053 | A1 | 2/2013 | Kususe et al. |
| 2013/0105827 | A1 | 5/2013 | Kim et al. |
| 2014/0091353 | A1 | 4/2014 | Lee et al. |
| 2014/0231839 | A1 | 8/2014 | Jeon et al. |
| 2014/0312369 | A1 | 10/2014 | Yoon et al. |
| 2014/0346553 | A1 | 11/2014 | Bernhardt |
| 2015/0034985 | A1 | 2/2015 | Tomizawa et al. |
| 2015/0194573 | A1 | 7/2015 | Lee et al. |
| 2018/0108812 | A1* | 4/2018 | Jung ....................... H01L 33/46 |
| 2019/0221714 | A1 | 7/2019 | Jung et al. |

FOREIGN PATENT DOCUMENTS

| | | |
|---|---|---|
| JP | 4976849 B2 | 7/2012 |
| JP | 2013-4546 A | 1/2013 |
| JP | 2014-44971 A | 3/2014 |
| JP | 2015-32621 A | 2/2015 |
| KR | 10-2010-0016491 A | 2/2010 |
| KR | 10-2014-0016516 A | 2/2014 |

* cited by examiner

LIGHT EMITTING DEVICE, LIGHT EMITTING DEVICE PACKAGE INCLUDING THE DEVICE, AND LIGHTING APPARATUS INCLUDING THE PACKAGE

CROSS-REFERENCE TO RELATED APPLICATIONS

This Application is a Continuation of co-pending U.S. patent application Ser. No. 15/561,415 filed on Sep. 25, 2017, which is the National Phase of PCT International Application No. PCT/KR2016/002713 filed on Mar. 17, 2016, which claims the priority benefit under 35 U.S.C. § 119(a) to Korean Patent Application No. 10-2015-0042677 filed in the Republic of Korea on Mar. 26, 2015, all of which are hereby expressly incorporated by reference into the present application.

BACKGROUND OF THE INVENTION

Field of the Invention

Embodiments relate to a light emitting device, a light emitting device package including the device, and a lighting apparatus including the package.

Discussion of the Related Art

Light Emitting Diodes (LEDs) are semiconductor devices that convert electricity into light using characteristics of compound semiconductors so as to enable transmission/reception of signals, or that are used as a light source.

Group III-V nitride semiconductors are in the spotlight as core materials of light emitting devices such as, for example, LEDs or Laser Diodes (LDs) due to physical and chemical characteristics thereof.

The LEDs do not include environmentally harmful materials such as mercury (Hg) that are used in conventional lighting appliances such as, for example, fluorescent lamps and incandescent bulbs, and thus are very eco-friendly, and have several advantages such as, for example, long lifespan and low power consumption. As such, conventional light sources are being rapidly replaced with LEDs.

In case of a conventional light emitting device package having a flip chip bonding structure, a distributed Bragg reflector (DBR) is used to reflect light emitted from the active layer. At this time, various problems may arise due to the use of the DBR.

SUMMARY OF THE INVENTION

Embodiments provide a light emitting device, a light emitting device package including the device, and a lighting apparatus including the package, which have the improved luminous flux and the excellent heat emission characteristics, may be protected from a high electric field, have a short period for a manufacturing process thereof, and has minimal or no cracking or peeling.

A light emitting device according to one embodiment may include a substrate; a light emitting structure disposed under the substrate, the light emitting structure including a first conductive semiconductor layer, an active layer, and a second conductive semiconductor layer; first and second electrodes connected to the first and second conductive semiconductor layers, respectively; a metal reflecting layer disposed under the light emitting structure; and a first insulating layer disposed between the first electrode and the light emitting structure, between the first electrode and the second electrode, and between the first electrode and the metal reflecting layer, wherein the metal reflecting layer includes: a first segment overlapped with the second electrode in a thickness direction of the light emitting structure; and a second segment disposed with extending from the first segment.

For example, the metal reflecting layer may have a cross-sectional shape symmetrical with respect to the second electrode in a direction perpendicular to the thickness direction of the light emitting structure.

For example, the second segment may include a second-first segment overlapped with the light emitting structure in the thickness direction; and a second 2-2 segment overlapped with the first-first insulating layer disposed between the first electrode and the light emitting structure, in the thickness direction. In addition, the second segment may further include a second-third segment overlapped with the first electrode in the thickness direction.

For example, the metal reflecting layer may be disposed to be electrically connected to the second electrode.

For example, the metal reflecting layer may be disposed to be separated by a separation distance of an odd multiple of $\lambda/(4n)$ (where, $\lambda$ represents a wavelength of light emitted from the active layer and n represents a refractive index of the first insulating layer) from a second well layer of the active layer, in the thickness direction of the light emitting structure. The separation distance may increase as the distance from the second electrode increases. The separation distance may increase stepwise.

For example, the metal reflecting layer 140 may have a curved cross-sectional shape.

For example, the first insulating layer may include a first-first insulating layer disposed between the first electrode and a side wall of the light emitting structure; and a first-second insulating layer disposed between the first electrode and the second electrode under each of the first-first insulating layer and the light emitting structure.

For example, the light emitting device may further include a second light-transmitting conductive layer disposed between the metal reflecting layer and the first-second insulating layer.

For example, the metal reflecting layer and the second electrode may include the same material. The light emitting device may further include first and second bonding pads connected to the first and second electrodes, respectively; and a second insulating layer disposed under the metal reflecting layer with exposing the second electrode, the second insulating layer electrically isolating the metal reflecting layer from the first bonding pad.

For example, at least two of the first-first insulating layer, the first-second insulating layer, or the second insulating layer may include the same material.

A light emitting device according to another embodiment may include a substrate; a light emitting structure disposed under the substrate, the light emitting structure including a first conductive semiconductor layer, an active layer, and a second conductive semiconductor layer; first and second electrodes connected to the first and second conductive semiconductor layers, respectively; a metal reflecting layer disposed under the light emitting structure; and a first insulating layer disposed between the first electrode and the light emitting structure, between the first electrode and the second electrode, and between the first electrode and the metal reflecting layer, wherein the metal reflecting layer is disposed to be electrically isolated from the second electrode.

For example, the first insulating layer may include a first-first insulating layer disposed between the first electrode and a side wall of the light emitting structure; and a first-second insulating layer disposed between the first electrode and the second electrode under each of the first-first insulating layer and the light emitting structure. For example, the light emitting device may further include a second light-transmitting conductive layer disposed between the metal reflecting layer and the first-second insulating layer.

For example, a third insulating layer may be disposed between the metal reflecting layer and the second electrode.

A light emitting device package according to still further embodiment may include the light emitting device, first and second lead frames configured to be electrically isolated from each other; a first solder portion configured to electrically connect the first conductive semiconductor layer to the first lead frame; and a second solder portion configured to electrically connect the second conductive semiconductor layer to the second lead frame.

A lighting apparatus according to still another embodiment may include the light emitting device package.

The light emitting device, the light emitting device package including the device, and the lighting apparatus including the package according to the embodiment may reflect light by using the metal reflecting layer, thereby not only having an improved luminous flux, solving the problems induced when using a distributed Bragg reflector (DBR), that is, the manufacturing process is complicated because DBR is sensitive to particles, it is difficult to manufacture the DBR to a desired thickness because the step coverage of the DBR is uneven, the manufacturing process period is long, and cracks or peeling are caused, but also eliminating the possibility of being broken at a high electric field because the metal reflecting layer serves as a field plate, and improving heat release characteristics.

BRIEF DESCRIPTION OF THE DRAWINGS

FIG. 2 is a plan view of a light emitting device shown in FIG. 1a.

FIG. 3 is an enlarged cross-sectional view of the portion 'A' shown in FIG. 1a.

FIG. 4a to FIG. 4i are cross-sectional views in process illustrating a method of manufacturing the light emitting device shown in FIG. 1a.

DETAILED DESCRIPTION OF THE EMBODIMENTS

Hereinafter, exemplary embodiments will be described in detail with reference to the accompanying drawings to aid in understanding of the embodiments. However, the embodiments may be altered in various ways, and the scope of the embodiments should not be construed as limited to the following description. The embodiments are intended to provide those skilled in the art with more complete explanation.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

In addition, the relative terms "first", "second", "top/upper/above", "bottom/lower/under" and the like in the description and in the claims may be used to distinguish between any one substance or element and other substances or elements and not necessarily for describing any physical or logical relationship between the substances or elements or a particular order.

Figure 1A:
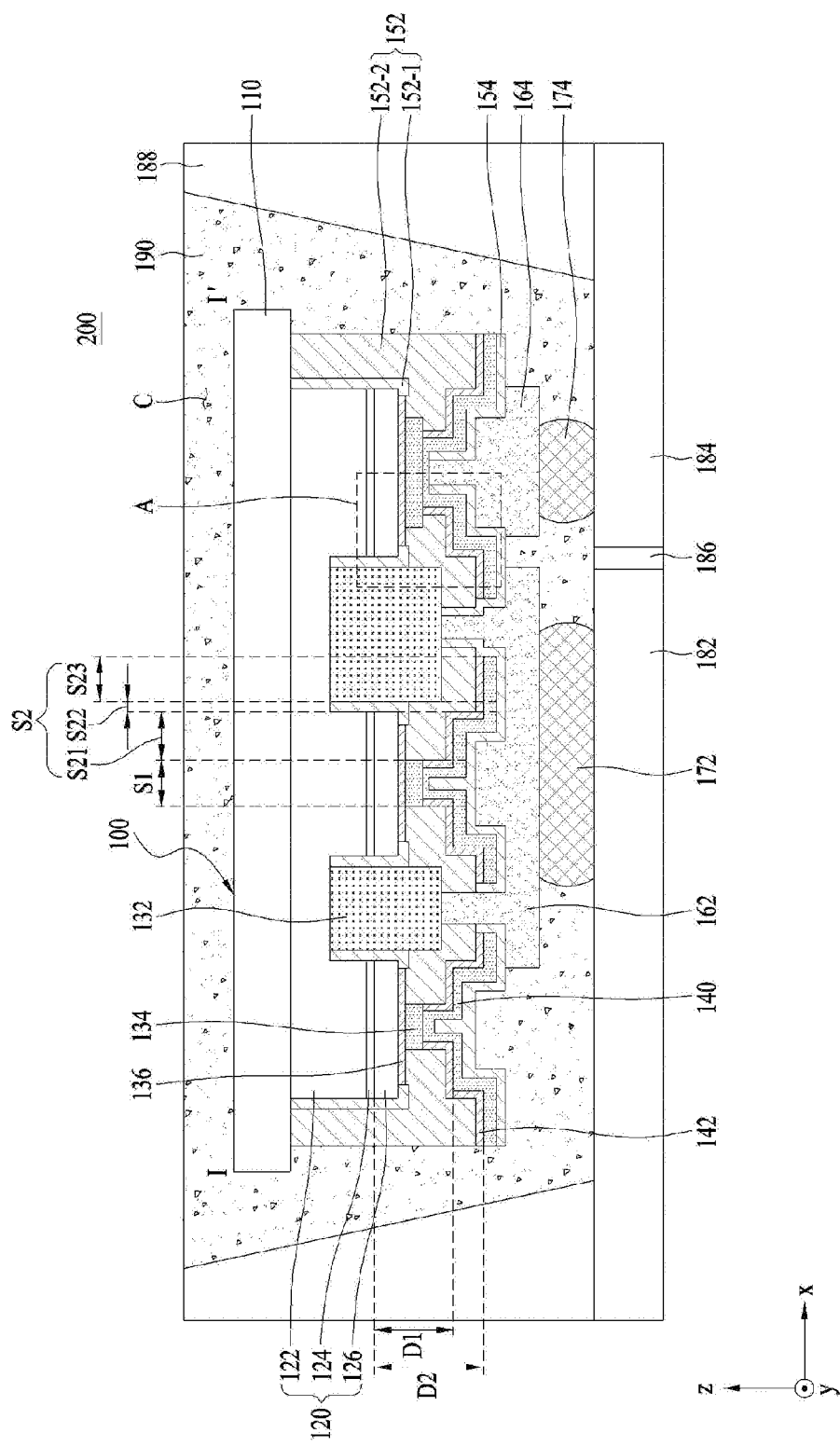
FIG. 1a is a cross-sectional view of a light emitting device package according to one embodiment.
Figure 1B:
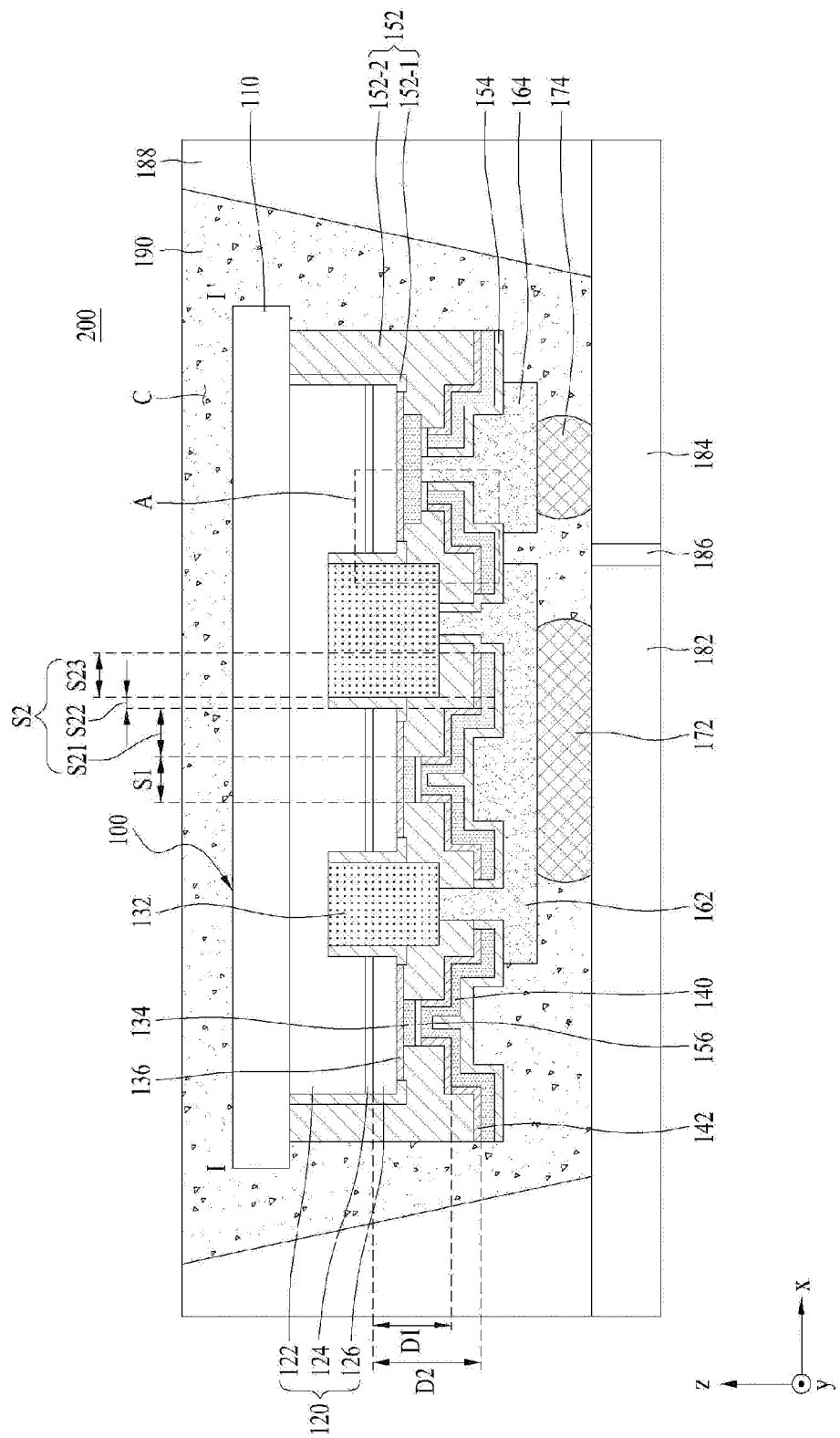
FIG. 1b is a cross-sectional view of a light emitting device package according to another embodiment.
Figure 2:
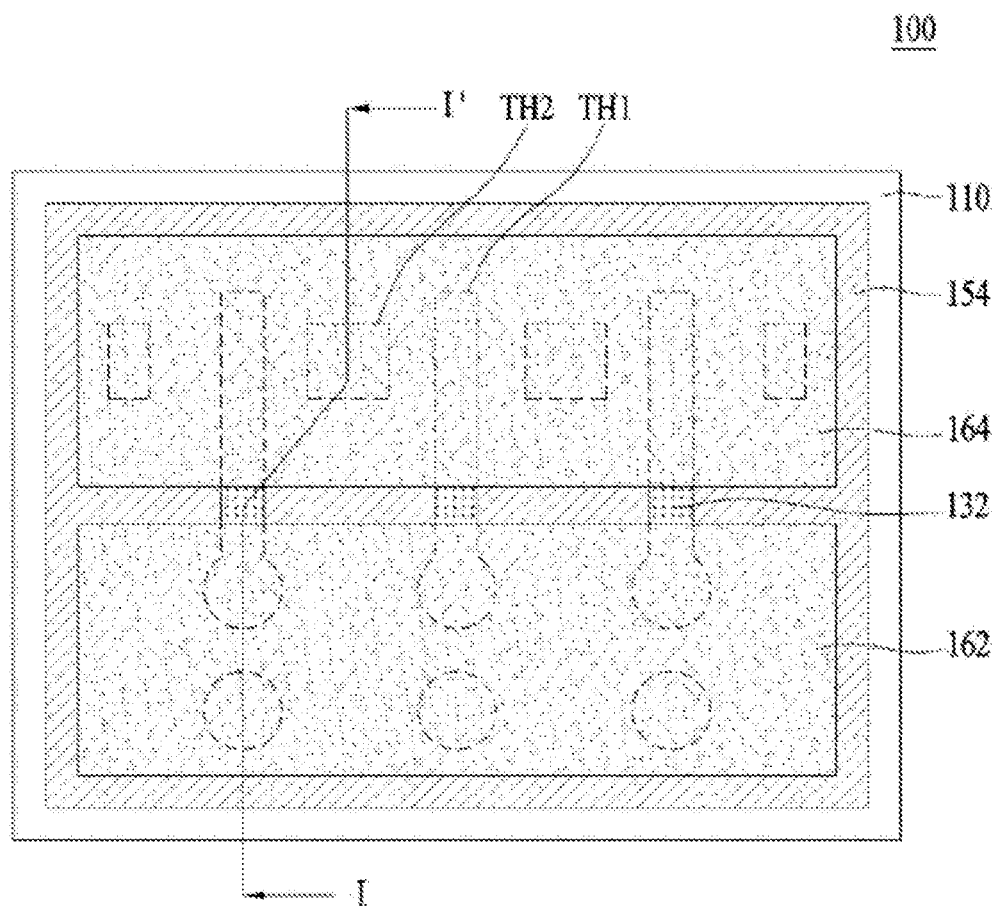

FIG. 1a is a cross-sectional view of a light emitting device package 200 according to one embodiment, FIG. 1b is a cross-sectional view of a light emitting device package 200 according to another embodiment, and FIG. 2 is a plan view of a light emitting device 100 shown in FIG. 1a.

The light emitting device 100 shown in FIG. 1a corresponds to a sectional view of the light emitting device 100 shown in taken along a line I-I' of FIG. 2. For ease understanding, the first and second through-holes TH1 and TH2 covered by the first and second bonding pads 162 and 164 are shown by dotted lines in FIG. 2.

Referring to FIG. 1a, a light emitting device package 200 may include a light emitting device 100, first and second solder portions 172 and 174, first and second lead frames 182 and 184, an insulating portion 186, a package body 188, and a molding member 190.

Referring to FIG. 1a to FIG. 2, the light emitting device 100 may include a substrate 110, a light emitting structure 120, first and second electrodes 132 and 134, a first light-transmitting conductive layer 136, a metal reflecting layer 140, a second light-transmitting conductive layer 142, first and second insulating layers 152 and 154, and first and second bonding pads 162 and 164.

The light emitting structure 120 may be disposed under the substrate 110. The substrate 110 may include a conductive material or non-conductive material. For example, the substrate 110 may include at least one of sapphire ($Al_2O_3$), GaN, SiC, ZnO, GaP, InP, $Ga_2O_3$, GaAs, or Si. In addition, the substrate 110, for example, may be a patterned sapphire substrate (PSS) having a pattern (not shown) in order to help a light emitted from the active layer 124 to escape from the light emitting device 100, but embodiment is not limited thereto.

In order to improve the difference in the coefficients of thermal expansion (CTE) and the lattice mismatch between the substrate 110 and the light emitting structure 120, a buffer layer (or a transition layer)(not illustrated) may be disposed between the two 110 and 120. The buffer layer, for example, may include at least one material selected from the group consisting of Al, In, N, and Ga, without being limited thereto. In addition, the buffer layer may have a single layer or multi-layer structure.

The light emitting structure 120 may include a first conductive semiconductor layer 122, an active layer 124, and a second conductive semiconductor layer 126 which are sequentially disposed under the substrate 110.

The first conductive semiconductor layer 122 may be disposed under the substrate 110 and implemented in, for example, group III-V or II-VI compound semiconductors doped with a first conductive dopant. When the first conductive semiconductor layer 122 is an n-type semiconductor layer, the first conductive dopant may include Si, Ge, Sn, Se, or Te as an n-type dopant without being limited thereto.

For example, the first conductive semiconductor layer 122 may include a semiconductor material having a composition formula of $Al_xIn_yGa_{(1-x-y)}N$ ($0 \leq x \leq 1$, $0 \leq y \leq 1$, $0 \leq x+y \leq 1$). The first conductive semiconductor layer 122 may include any one or more materials selected from among GaN, InN, AlN, InGaN, AlGaN, InAlGaN, AlInN, AlGaAs, InGaAs, AlInGaAs, GaP, AlGaP, InGaP, AlInGaP, and InP.

The active layer 124 is disposed between the first conductive semiconductor layer 122 and the second conductive semiconductor layer 126. The active layer 124 is a layer in which electrons (or holes) injected through the first conductive semiconductor layer 122 and holes (or electrons) injected through the second conductive semiconductor layer 126 meet each other to emit light having energy determined by an inherent energy band of a constituent material of the active layer 124. The active layer 124 may be formed into at least one structure of a single-well structure, a multi-well structure, a single-quantum well structure, a multi-quantum well structure, a quantum wire structure, or a quantum dot structure.

The active layer 124 may include a well layer and a barrier layer having a pair structure of any one or more of InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer (not illustrated) may be formed above and/or under the active layer 124. The conductive clad layer may be formed of semiconductors having higher band gap energy than the band gap energy of the barrier layer of the active layer 124. For example, the conductive clad layer may include GaN, AlGaN, InAlGaN, or a super lattice structure. In addition, the conductive clad layer may be doped with an n-type or p-type dopant.

The second conductive semiconductor layer 126 may be disposed under the active layer 124. The second conductive semiconductor layer 126 may be formed of a semiconductor compound, and may be formed of, for example, group III-V or II-VI compound semiconductors. For example, the second conductive semiconductor layer 126 may include a semiconductor material having a composition formula of $In_xAl_yGa_{1-x-y}N$ ($0 \leq x \leq 1$, $0 \leq y \leq 1$, $0 \leq x+y \leq 1$). The second conductive semiconductor layer 126 may be doped with a second conductive dopant. When the second conductive semiconductor layer 126 is a p-type semiconductor layer, the second conductive dopant may include Mg, Zn, Ca, Sr, or Ba, etc., as a p-type dopant.

The first conductive semiconductor layer 122 may be an n-type semiconductor layer, and the second conductive semiconductor layer 126 may be a p-type semiconductor layer. Alternatively, the first conductive semiconductor layer 122 may be a p-type semiconductor layer, and the second conductive semiconductor layer 126 may be an n-type semiconductor layer.

The light emitting structure 120 may be implemented in any one structure selected from among an n-p junction structure, a p-n junction structure, an n-p-n junction structure, and a p-n-p junction structure.

Since each of the light emitting device packages 200 and 300 shown in FIG. 1a to FIG. 2 has a flip chip bonding structure, the light emitted from the active layer 124 is emitted through the substrate 110 and the first conductive semiconductor layer 122. For this, the substrate 110 and the first conductive semiconductor layer 122 may be made of a light-transmitting material, and the second conductive semiconductor layer 126 and the second electrode 134 may be made of a light-transmitting material or a light non-transmitting material.

The first electrodes 132 may be disposed under the first conductive semiconductor layer 122, which is exposed by passing through the second conductive semiconductor layer 126, the active layer 124, and a part of the first conductive semiconductor layer 122 to be electrically connected to the first conductive semiconductor layer 122. The first electrode 132 includes an ohmic contact material, and serve as an ohmic layer. Thus, a separate ohmic layer (not illustrated) to be disposed may be unnecessary, or a separate ohmic layer may be disposed between the first electrodes 132 and the first conductive semiconductor layer 122.

In addition, the first electrode 132 may be formed of any material that may not absorb the light emitted from the active layer 124, but that may reflect or transmit the light and that may be grown to a good quality on the first conductive semiconductor layer 122. For example, the first electrode 132 may be formed of a metal, and more specifically may be formed of Ag, Ni, Ti, Al, Rh, Pd, Ir, Ru, Mg, Zn, Pt, Au, Hf, Cr, or a selective combination thereof. For example, the first electrode 132 may be implemented as Ti/Al/Ti/Ni/Ti, but the embodiment is not limited thereto.

The second electrode 134 may be disposed under the second conductive semiconductor layer 126 so as to be electrically connected to the second conductive semiconductor layer 126. The second electrode 134 may be formed of Al, Au, Ag, Ni, Pt, Rh, Ti, Cr, or a metal layer including an alloy including Al, Ag, Pt or Rh. For example, the second electrode 134 may be implemented as Ag/Ni/Ti, but the embodiment is not limited thereto.

The first light-transmitting conductive layer 136 may be disposed between the second electrode 134 and the second conductive semiconductor layer 126. The first light-transmitting conductive layer 136 may serve as an ohmic layer. For this, the first light-transmitting conductive layer 136 may be a transparent conductive oxide (TCO) layer. For example, the first light-transmitting conductive layer 136 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but is not limited to these materials.

If the second electrode 134 may function as an ohmic layer, the first light-transmitting conductive layer 136 may be omitted.

Meanwhile, the metal reflecting layer 140 may be disposed under the light emitting structure 120 and play the role of reflecting light traveling in a lower direction (for example, the −z axis direction) of the light emitting structure 120.

In addition, the metal reflecting layer 140 may include the first and second segments S1 and S2.

The first segment S1 may mean to a part of the metal reflecting layer 140 that is overlapped with the second electrode 134, in a thickness direction (e.g., the z-axis direction) (hereinafter, referred to as a 'first direction') of the light emitting structure 120.

The second segment S2 may mean a part disposed with extending from the first segment S1 in the metal reflecting layer 140. At this time, the second segment S2 may include at least one of the second-first, second-second, and second-third segments S21, S22, or S23.

The second-first segment S21 may mean a part of the metal reflecting layer 140 that is not vertically overlapped with the second electrode 134 in the first direction, but vertically overlapped with the light emitting structure 120. That is, the second-first segment S21 may mean a part except for the first segment, that is, the part overlapped with the second electrode 134 in the first direction of the vertical direction, among the parts of the metal reflecting layer 140 that are overlapped with the light emitting structure 120 in the first direction of the vertical direction.

The second-second segment S22 may mean a part of the metal reflecting layer 140 that is vertically overlapped in the first direction with the first-first insulating layer 152-1 disposed between the first electrode 132 and the light emitting structure 120.

The second-third segment S23 may mean a part of the metal reflecting layer 140 that is vertically overlapped with the first electrode 132 in the first direction.

In addition, the metal reflecting layer 140 may have a cross-sectional shape symmetrical with respect to the second electrode 134 in a direction (for example, an x-axis direction or a y-axis direction) perpendicular to the first direction. Hereinafter, the x-axis direction is referred to as a 'second direction' and the y-axis direction is referred to as a 'third direction.' For example, as shown in FIG. 1a, the metal reflecting layer 140 may have a cross-sectional shape symmetrical with respect to the second electrode 134 in the second direction. However, according to another embodiment, the metal reflecting layer 140 may have a cross-sectional shape asymmetrical with respect to the second electrode 134 in at least one direction of the second or third direction.

In addition, as shown in FIG. 1a, the metal reflecting layer 140 may be disposed to be electrically connected to the second electrode 134. Thus, when the metal reflecting layer 140 is electrically connected to the second electrode 134, the metal reflecting layer 140 may perform a reflection function for reflecting light, a heat dissipation function, and a function of the field plate later described.

Alternatively, as shown in FIG. 1b, a third insulating layer 156 may be disposed between the metal reflecting layer 140 and the second electrode 134 to electrically isolate the metal reflecting layer 140 from the second electrode 134. In this case, the metal reflecting layer 140 may perform only a reflection function.

And, the third insulating layer 156 may include at least one of $SiO_2$, $TiO_2$, $ZrO_2$, $Si_3N_4$, $Al_2O_3$, or $MgF_2$.

Figure 3:
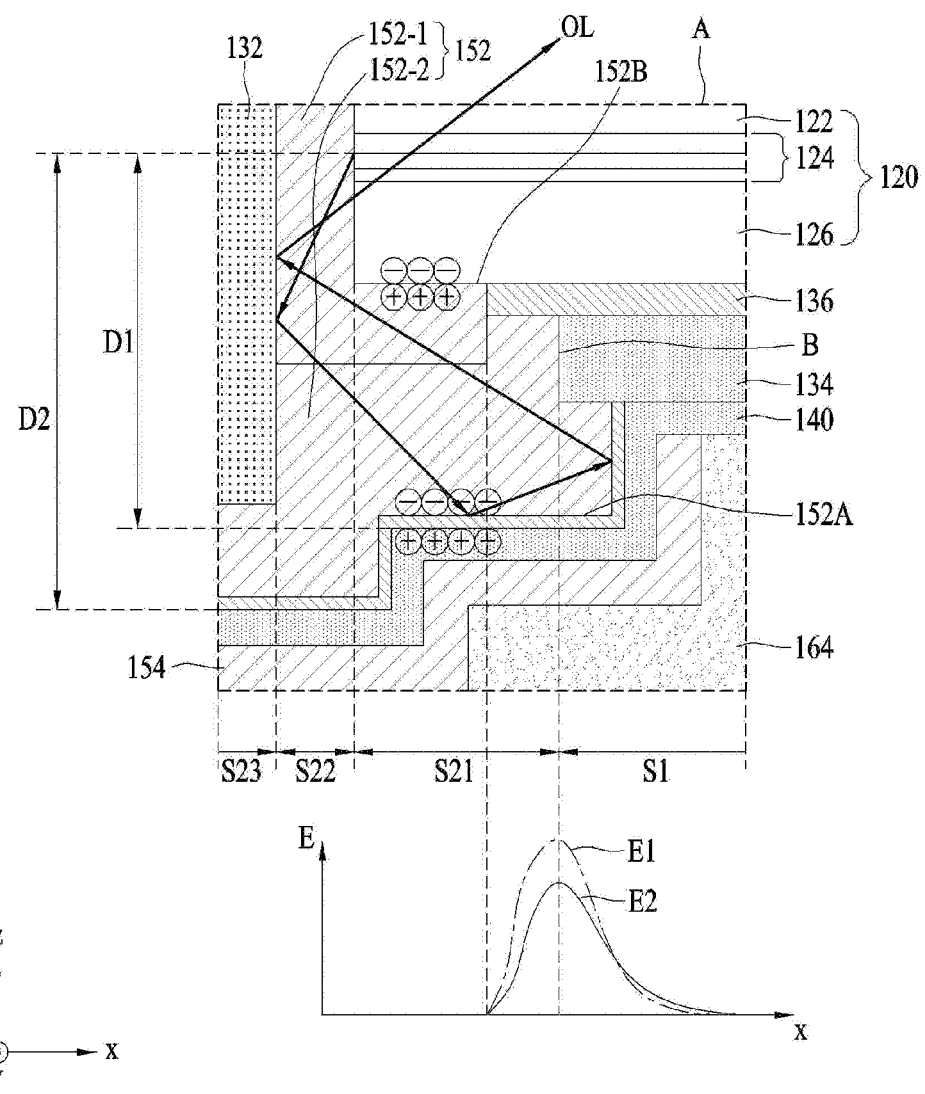

FIG. 3 is an enlarged cross-sectional view of the portion 'A' shown in FIG. 1a.

Referring to FIG. 3, the metal reflecting layer 140 may be disposed with being separated by the odd multiple of $\lambda/(4n)$ from the second well layer of the active layer 124 in the first direction. Here, $\lambda$ represents the wavelength of the light emitted from the active layer 124, and n represents the refractive index of the first insulating layer 152 (for example, the first-second insulating layer 152-2). Thus, when the metal reflecting layer 140 is separated by the odd multiple of $\lambda/(4n)$ from the second well layer of the active layer 124 in the first direction, the light extraction efficiency of the light emitting device package 200 may be maximized.

At least a portion of the second-first segment S21 of the metal reflecting layer 140 may be separated from the second well layer of the active layer 124 by a first separation distance D1 in the first direction. At least a portion of the second-second and second-third segments S22 and S23 may be separated from the second well layer of the active layer 124 by a second separation distance D2 in the first direction. For example, the first separation distance D1 may be $\lambda i/(4n)$, and the second separation distance D2 may be $\lambda j/(4n)$. Where i and j are odd, and j may be greater than i.

In addition, the distance by which the metal reflecting layer 140 is separated from the second well layer of the active layer 124 in the first direction may increase as the distance from the second electrode 134 increases. For example, as shown in FIG. 1a, the distance by which the metal reflecting layer 140 is separated from the second well layer of the active layer 124 in the first direction may increase stepwise. As such, the metal reflecting layer 140 may have a curved cross-sectional shape, but the embodiment is not limited thereto.

As described above, the light extraction efficiency may be maximized when the metal reflecting layer 140 is arranged so as to be separated from the second well layer of the active layer 124 by an odd multiple of $\lambda/(4n)$ in the first direction. The thicknesses of the first-first and first-second insulating layers 152-1 and 152-2 may be determined so as to satisfy the separation distance.

Referring to FIG. 1a and FIG. 1b, the metal reflecting layer 140 may include the same material as or a different material from the second electrode 134 described above. For example, the metal reflecting layer 140 may be formed of a metal such as Al, Au, Ag, Ni, Pt, Rh, Ti, Cr, a metal layer including an alloy including Al, Ag, Pt or Rh, but the embodiment is not limited thereto.

The first insulating layer 152 may be disposed between the first electrode 132 and the sidewall of the light emitting structure 120, between the first electrode 132 and the second electrode 134, and between the first electrode 132 and the metal reflecting layer 140, respectively.

The first insulating layer 152 may include a first-first insulating layer 152-1 and a first-second insulating layer 152-2. The first-first insulating layer 152-1 may be disposed between the first electrode 132 and the side wall of the light emitting structure 120. Also, the first-first insulating layer 152-1 may be disposed with extending from a side wall of the light emitting structure 120 to under a lower edge of the light emitting structure 120.

The first-first insulating layer 152-1 may serve as a sort of current blocking layer (CBL) and may play the role of electrically isolating the first electrode 132 from the side of the light emitting structure 120. For example, the first-first insulating layer 152-1 may include at least one of $SiO_2$, $TiO_2$, $ZrO_2$, $Si_3N_4$, $Al_2O_3$, or $MgF_2$.

The first-second insulating layer 152-2 may be disposed between the first electrode 132 and the second electrode 134 under respective the first-first insulating layer 152-1 and the light emitting structure 120. The first electrode 132 and the second electrode 134 may be electrically separated from each other by disposing the first-second insulating layer 152-2. For example, the first-second insulating layers 152-2 may include at least one of $SiO_2$, $TiO_2$, $ZrO_2$, $Si_3N_4$, $Al_2O_3$, or $MgF_2$.

Further, the second light-transmitting conductive layer 142 may be disposed between the metal reflecting layer 140 and the first-second insulating layer 152-2. Thus, when the second light-transmitting conductive layer 142 is disposed, the adhesion between the metal reflecting layer 140 and the first-second insulating layer 152-2 may be improved. In some cases, the second light-transmitting conductive layer 142 may be omitted.

The second light-transmitting conductive layer 142 may include the same material as or a different material from the first light-transmitting conductive layer 136, but the embodiment is not limited thereto.

The second light-transmitting conductive layer 142 may be a transparent conductive oxide (TCO) layer. For example, the second light-transmitting conductive layer 142 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but is not limited to these materials.

The second insulating layer 154 may be disposed under the metal reflecting layer 140 while forming the first and second through-holes TH1 and TH2. Here, the first through-hole TH1 exposes the first electrode 132 and the second through-hole TH2 exposes the second electrode 134. Each of the first and second through-holes TH1 and TH2 may be a blind hole.

The second insulating layer 154 is disposed below the metal reflecting layer 140 so that the metal reflecting layer 140 and the first bonding pad 162 may be electrically separated from each other.

In addition, the second insulating layer 154 may be disposed between the second bonding pad 164 and the metal reflecting layer 140. At this time, the second insulating layer 154 is not disposed between the second electrode 134 and the second bonding pad 164. However, according to another embodiment, the second insulating layer 154 may not be disposed between the second bonding pad 164 and the metal reflecting layer 140.

The second insulating layer 154 may include at least one of $SiO_2$, $TiO_2$, $ZrO_2$, $Si_3N_4$, $Al_2O_3$, or $MgF_2$.

At least two of the first-first insulating layer 152-1, the first-second insulating layer 152-2, or the second insulating layer 154 may include the same material. For example, all of the first-first insulating layer 152-1, the first-second insulating layer 152-2, and the second insulating layer 154 may be made of the same material. Alternatively, the first-first insulating layer 152-1 and the first-second insulating layer 152-2 may be made of the same material, and the second insulating layer 154 may be made of the material different from each of the first-first insulating layer 152-1 and the first-second insulating layer 152-2.

The first bonding pad 162 may be embedded in the first through-hole TH1 defined by the second insulating layer 154 and may be electrically connected to the first electrode 132. That is, the first bonding pad 162 may be electrically connected to the first conductive semiconductor layer 122 through the first electrode 132.

The second bonding pad 164 may be embedded in the second through-hole TH2 defined by the second insulating layer 154 to be electrically connected to the second electrode 134. That is, the second bonding pad 164 may be electrically connected to the second conductive semiconductor layer 126 through the second electrode 134.

The first bonding pad 162 and the second bonding pad 164 may be disposed with being spaced apart from each other in a second or third direction orthogonal to the first direction.

Each of the first and second bonding pads 162 and 164 may include a metallic material having electrical conductivity and may include the same material as or a different material from each of the first and second electrodes 132 and 134. Each of the first and second bonding pads 162 and 164 may include at least one of Ti, Ni, Au, or Sn, but the embodiment is not limited thereto. For example, each of the first and second bonding pads 162 and 164 may be implemented as a form of Ti/Ni/Ti/Ni/Cu/Ni/Au.

The first and second lead frames 182 and 184 may be electrically isolated from each other by an insulating portion 186. The first lead frame 182 may be electrically connected to the first bonding pad 162 via the first solder portion 172 and the second lead frame 184 may be electrically connected to the second bonding pad 164 through the second solder portion 174. The first and second lead frames 182 and 184 may be electrically isolated from each other by the insulating portion 186. Each of the first and second lead frames 182 and 184 may be made of a conductive material, e.g., metal, and the embodiment is not limited to the type of material of each of the first and second lead frames 182 and 184.

The insulating portion 186 may be disposed between the first and second lead frames 182 and 184 to electrically isolate the first and second lead frames 182 and 184 from each other. For this purpose, the insulating portion 186 may include at least one of $SiO_2$, $TiO_2$, $ZrO_2$, $Si_3N_4$, $Al_2O_3$, or $MgF_2$, but embodiment is not limited thereto.

The first solder part 172 may be disposed between the first bonding pad 162 and the first lead frame 182, in order to play the role of electrically connecting the first bonding pad 162 to the first lead frame 182. The first solder part 172 is electrically connected to the first conductive semiconductor layer 122 via the first bonding pad 162 and the first electrode 132. Accordingly, the first solder part 172 may electrically connect the first conductive semiconductor layer 122 to the first lead frame 182.

The second solder portion 174 may be disposed between the second bonding pad 164 and the second lead frame 184 in order to play the role of electrically connect the second bonding pad 164 to the second lead frame 184. The second solder part 174 is electrically connected to the second conductive semiconductor layer 126 via the second bonding pad 164, the second electrode 134, and the first light-transmitting conductive layer 136. Accordingly, the second solder portion 174 may electrically connect the second conductive semiconductor layer 126 to the second lead frame 184.

Each of the first and second solder portions 172 and 174 may be a solder paste or a solder ball, but the embodiment is not limited thereto. In some cases, the first solder portion 172 and the second solder portion 174 may be omitted. In this case, the first bonding pad 162 may serve as the first solder portion 172, and the second bonding pad 164 may serve as the second solder portion 174. That is, when the first solder part 172 and the second solder part 174 are omitted, the first bonding pad 162 may be directly connected to the first lead frame 182, and the second bonding pad 164 may be directly connected to the second lead frame 184.

In addition, the package body 188 may define the cavity C with the first and second lead frames 182 and 184, but the embodiment is not limited thereto. According to another embodiment, the cavity C may be defined with only the package body 188. Alternatively, a barrier wall (not shown) may be disposed on the package body 188 having a flat upper surface, and a cavity may be defined by the barrier wall and the upper surface of the package body 188.

The light emitting device 100 may be disposed in the cavity C as shown in FIGS. 1a and 1b.

The package body 188 may be formed of silicon, synthetic resin, or metal. The first and second lead frames 182 and 184 may be a part of the package body 188 if the package body 188 is made of a conductive material, for example a metallic material. Even in this case, the package bodies 188 forming the first and second lead frames 182 and 184 may be electrically separated from each other by the insulating portion 186.

In addition, the molding member 190 may be arranged to surround and protect the light emitting device 100 disposed in the cavity C. The molding member 190 may be formed of, for example, silicon (Si), and may convert the wavelength of light emitted from the light emitting device 100 because it includes a fluorescent substance. Although the fluorescent substance may include a fluorescent material of any wavelength conversion portion that may convert the light generated in the light emitting device 100 into white light such as a YAG-based, TAG-based, silicate-based, sulfide-based, or nitride-based fluorescent substance, the embodiment is not limited as to the type of the fluorescent substance.

The YGA-based and TAG-based fluorescent substances may be selected from among (Y, Tb, Lu, Sc, La, Gd, Sm)3(Al, Ga, In, Si, Fe)5(O, S)12:Ce, and the silicate-based fluorescent substance may be selected from among (Sr, Ba, Ca, Mg)2SiO4:(Eu, F, Cl).

In addition, the sulfide-based fluorescent substances may be selected from among (Ca, Sr)S:Eu, (Sr, Ca, Ba)(Al, Ga)2S4:Eu, and the nitride-based fluorescent substances may be selected from among (Sr, Ca, Si, Al, O)N:Eu (e.g., CaAlSiN4:Eu β-SiAlON:Eu) or Ca-α SiAlON:Eu-based (Cax, My)(Si, Al)12(O, N)16 (here, M is at least one of Eu, Tb, Yb or Er, 0.05<(x+y)<0.3, 0.02<x<0.27, and 0.03<y<0.3, which is fluorescent substance).

Red fluorescent substances may be nitride-based fluorescent substances including N (e.g., CaAlSiN3:Eu). The nitride-based red fluorescents substance have higher reliability in resistance to external environments such as, for example, heat and moisture, and lower discoloration risk than sulfide-based fluorescent substance.

Hereinafter, a method of manufacturing the light emitting device 100 shown in FIG. 1*a* will be described with reference to FIG. 4*a* to FIG. 4*i* as follows, but the embodiment is not limited thereto. That is, the light emitting device 100 shown in FIG. 1A, of course, may be manufactured by another manufacturing method.

FIGS. 4*a* to 4*i* are cross-sectional views in process illustrating a method of manufacturing the light emitting device 100 shown in FIG. 1*a*.

Figure 4A:
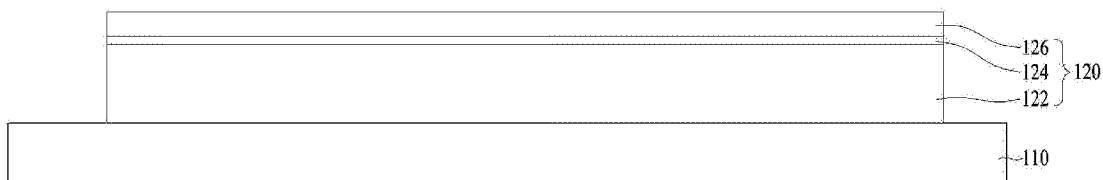

Referring to FIG. 4*a*, a light emitting structure 120 may be formed by sequentially laminating a first conductive semiconductor layer 122, an active layer 124, and a second conductive semiconductor layer 126 on a substrate 110.

The substrate 110 may include a conductive material or non-conductive material. For example, the substrate 110 may include at least one of sapphire ($Al_2O_3$), GaN, SiC, ZnO, GaP, InP, $Ga_2O_3$, GaAs, or Si.

The first conductive semiconductor layer 122 may be formed by using group III-V or II-VI compound semiconductors, etc., doped with a first conductive dopant. When the first conductive semiconductor layer 122 is an n-type semiconductor layer, the first conductive dopant may include Si, Ge, Sn, Se, or Te as an n-type dopant, without being limited thereto.

For example, the first conductive semiconductor layer 122 may be formed by using a semiconductor material having a composition formula of $Al_xIn_yGa_{(1-x-y)}N$ ($0\leq x \leq 1$, $0\leq y \leq 1$, $0\leq x+y \leq 1$). The first conductive semiconductor layer 122 may be formed by using any one or more materials selected from among GaN, InN, AlN, InGaN, AlGaN, InAlGaN, AlInN, AlGaAs, InGaAs, AlInGaAs, GaP, AlGaP, InGaP, AlInGaP, and InP.

The active layer 124 may be formed into at least one structure selected from among a single-well structure, a multi-well structure, a single-quantum well structure, a multi-quantum well structure, a quantum wire structure, and a quantum dot structure.

A well layer and a barrier layer of the active layer 124 may be formed to have a pair structure of any one or more of InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer (not illustrated) may be formed above and/or under the active layer 124. The conductive clad layer may be formed of semiconductors having higher band gap energy than the band gap energy of the barrier layer of the active layer 124. For example, the conductive clad layer may include GaN, AlGaN, InAlGaN, or a super lattice structure. In addition, the conductive clad layer may be doped with an n-type or p-type dopant.

The second conductive semiconductor layer 126 may be formed of a semiconductor compound, and may be formed of group III-V or II-VI compound semiconductors, etc. For example, the second conductive semiconductor layer 126 may include a semiconductor material having a composition formula of $In_xAl_yGa_{1-x-y}N$ ($0\leq x\leq 1$, $0\leq y\leq 1$, $0\leq x+y\leq 1$). The second conductive semiconductor layer 126 may be doped with a second conductive dopant. When the second conductive semiconductor layer 126 is a p-type semiconductor layer, the second conductive dopant may include Mg, Zn, Ca, Sr, or Ba, etc., as a p-type dopant.

Figure 4B:
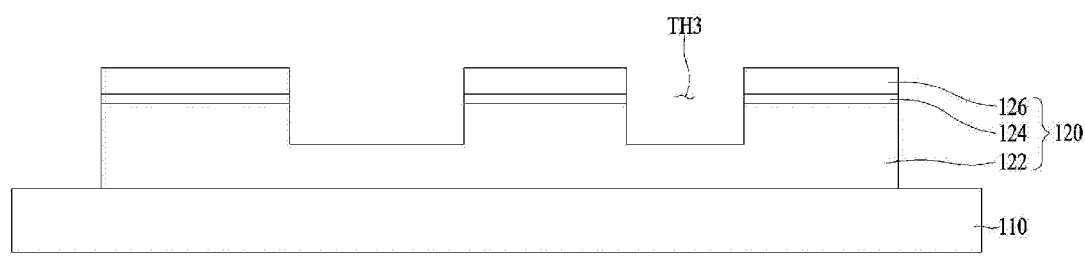

Subsequently, referring to FIG. 4*b*, the third through-hole TH3 exposing the first conductive semiconductor layer 122 may be formed by mesa-etching the second conductive semiconductor layer 126, the active layer 124, and the first conductive semiconductor layer 122. Since the third through-hole TH3 is formed, the sides of the second conductive semiconductor layer 126 and the active layer 124 of the light emitting structure 120 may be exposed in the third through-hole TH3.

Figure 4C:
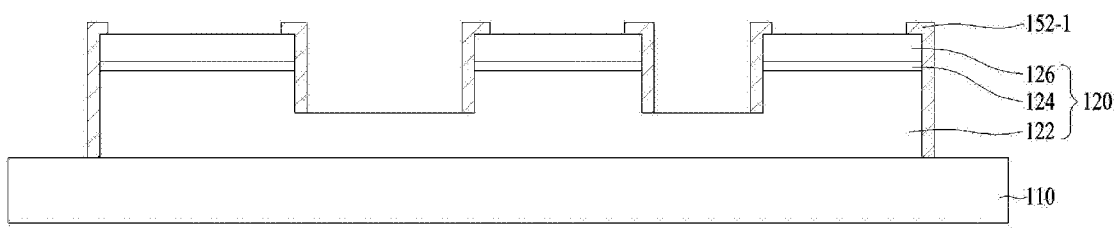

Subsequently, referring to FIG. 4*c*, the first-first insulating layer 152-1 may be formed to surround the sidewall and the upper edge of the light emitting structure 120 exposed in the third through-hole TH3 and to expose an upper portion of a second conductive semiconductor layer 126 on which the first light-transmitting conductive layer 136 is to be formed.

For example, the first-first insulating layer 152-1 may include at least one of $SiO_2$, $TiO_2$, $ZrO_2$, $Si_3N_4$, $Al_2O_3$, or $MgF_2$.

Figure 4D:
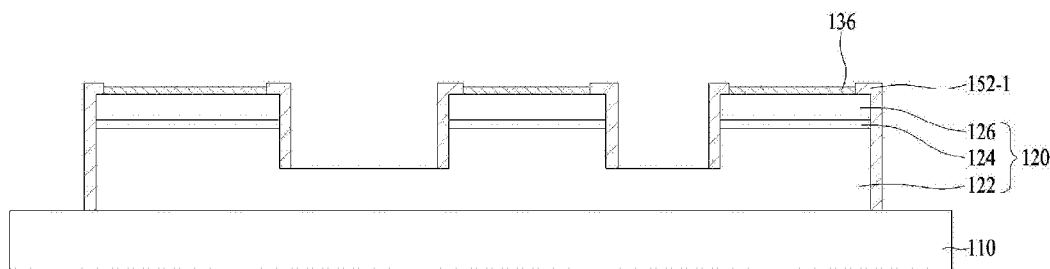

Subsequently, referring to FIG. 4*d*, a first light-transmitting conductive layer 136 is formed on the second conductive semiconductor layer 126 exposed by the first-first insulating layer 152-1. For example, the first light-transmitting conductive layer 136 may be formed by depositing ITO on the second conductive semiconductor layer 126 exposed by the first-first insulating layer 152-1 and then performing heat treatment.

The first light-transmitting conductive layer 136 may be a transparent conductive oxide (TCO) layer. For example, the first light-transmitting conductive layer 136 may be formed by using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but is not limited to these materials.

Figure 4E:
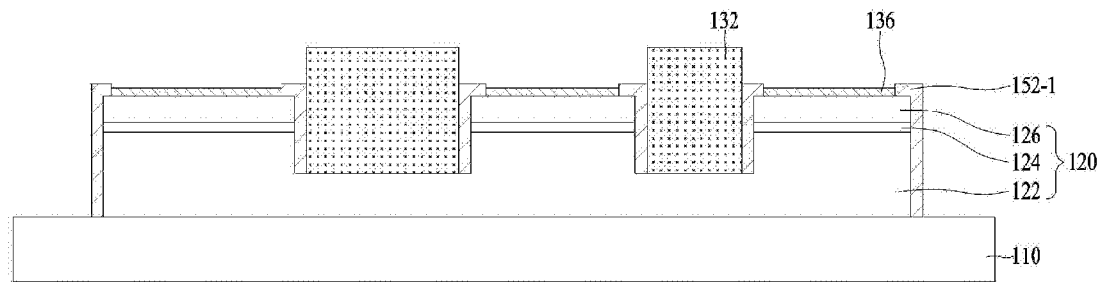

Subsequently, referring to FIG. 4*e*, a first electrode 132 is formed on the first conductive semiconductor layer 122 not covered and exposed by the first-first insulating layer 152-1, with being buried in the third through-hole TH3. The first electrode 132 may be formed of a metal and may be implemented by Ag, Ni, Ti, Al, Rh, Pd, Ir, Ru, Mg, Zn, Pt, Au, Hf, Cr, or a selective combination thereof.

Figure 4F:
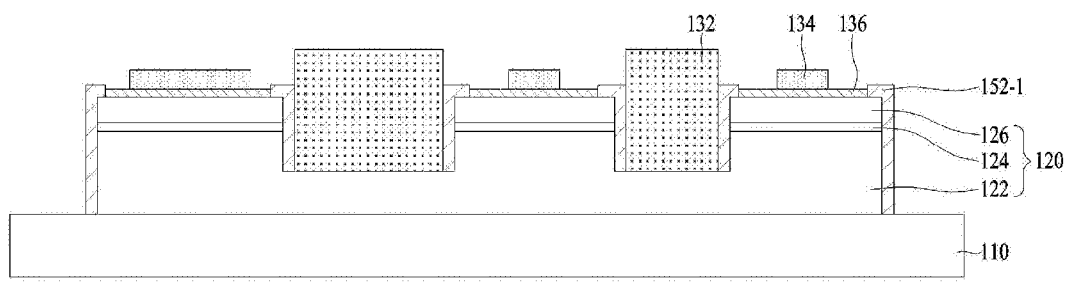

Subsequently, referring to FIG. 4*f*, a second electrode 134 is formed on the first light-transmitting conductive layer 136. The second electrode 134 may be formed of a metal such as Al, Au, Ag, Ni, Pt, Rh, Ti, Cr, Or a metal layer containing an alloy including Al, Ag, Pt or Rh.

Figure 4G:
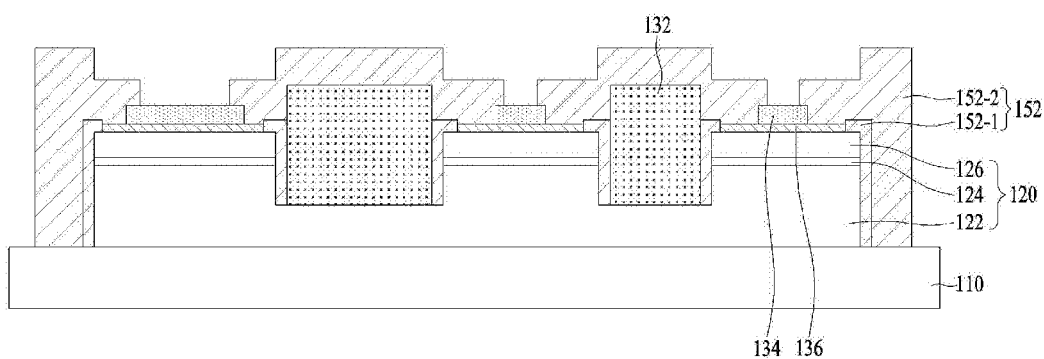

Subsequently, referring to FIG. 4*g*, the first-second insulating layer 152-2 is formed on the light emitting structure 120 with covering a side and an upper portion of the first-first insulating layer 152-1 while exposing the upper region of the second electrode 134. The first-second insulating layer 152-2 may include the same material as or a different material from the first-first insulating layer 152-1. For example, the first-second insulating layers 152-2 may be formed using at least one of $SiO_2$, $TiO_2$, $ZrO_2$, $Si_3N_4$, $Al_2O_3$, or $MgF_2$.

Figure 4H:
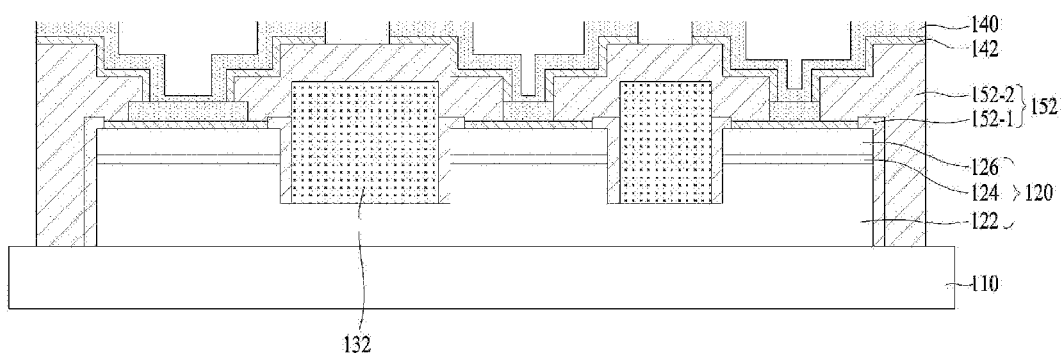

Subsequently, referring to FIG. 4h, a metal reflecting layer 140 is formed on the upper portion of the second electrode 134, which is not covered and exposed by the first-second insulating layer 152-2, and on the first-second insulating layer 152-2. In order to improve the adhesion between the metal reflecting layer 140 and the first-second insulating layer 152-2, the second light-transmitting conductive layer 142 may be further formed on the first-second insulating layer 152-2, before the metal reflecting layer 140 is formed. However, according to another embodiment, the formation of the second light-transmitting conductive layer 142 may be omitted.

The metal reflecting layer 140 may include the same material as or a different material from the second electrode 134 described above. For example, the metal reflecting layer 140 may be formed of a metal such as Al, Au, Ag, Ni, Pt, Rh, Ti, Cr, or a metal layer including an alloy including Al, Ag, Pt, or Rh, but the embodiment is not limited thereto.

The second light-transmitting conductive layer 142 may be formed using the same material as or a different material from the first light-transmitting conductive layer 136 described above, but the embodiment is not limited thereto. The second light-transmitting conductive layer 142 may a transparent conductive oxide (TCO) layer. For example, the second light-transmitting conductive layer 142 may be formed using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but is not limited to these materials.

Figure 4I:
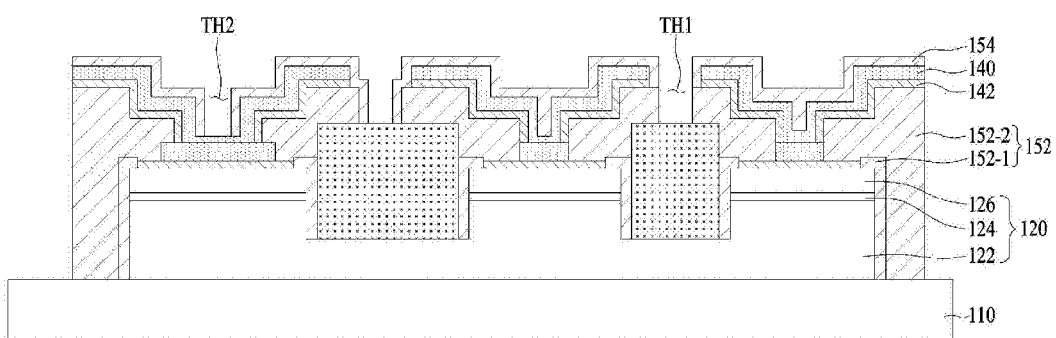

Subsequently, referring to FIG. 4i, the second insulating layer 154 may be formed on the resultant structure shown in FIG. 4h with defining the first through-hole TH1 exposing the upper portion of the first electrode 132 and the second through-hole TH2 exposing the upper portion of the second electrode 134. The second insulating layer 154 may be formed of the same material as or a different material from each of the first-first and first-second insulating layers 152-1 and 152-2. The second insulating layer 154 may be formed using at least one of $SiO_2$, $TiO_2$, $ZrO_2$, $Si_3N_4$, $Al_2O_3$, or $MgF_2$.

Subsequently, referring to FIG. 1a to FIG. 2, a first bonding pad 162 is embedded in the first through-hole TH1 and a second bonding pad 164 is embedded in the second through-hole TH2 so that the light emitting device 100 may be completed.

Each of the first and second bonding pads 162 and 164 may include a metallic material having electrical conductivity and may include the same material as or different material from each of the first and second electrodes 132 and 134. Each of the first and second bonding pads 162 and 164 may be formed using at least one of Ti, Ni, Au, or Sn, but the embodiment is not limited thereto.

Each of the light emitting device packages 200 and 300 according to the above-described embodiments has a flip chip bonding type structure. Therefore, in order to emitting the light emitted from the active layer 124 in the upper direction (for example, the +z-axis direction) or in the side direction (for example, the x-axis direction), it is necessary to reflect toward the upper direction light traveling in the lower direction (for example, the −z-axis direction). Therefore, in the case of the light emitting device package 200 or 300 according to the embodiment, the luminous flux may be improved by reflecting the light upward using the metal reflecting layer 140. For example, as marked by an arrow OL in FIG. 3, the light emitted from the active layer 124 is reflected by the first electrode 132, and then reflected by the metal reflecting layer 140, and then again reflected by the first electrode 132, and then may be emitted upwardly.

Also, when a Distributed Bragg Reflector (DBR) (not shown) is used instead of the metal reflecting layer 140 in the embodiment, to reflect light, the following problems may be caused.

The DBR is sensitive to particle. Therefore, when particles are present in the process for manufacturing DBR, the DBR may not be formed properly. However, when the metal reflecting layer 140 is used as in the embodiment instead of the DBR, the metal reflecting layer 140 is not sensitive to the particles unlike the DBR so that the manufacturing process conditions are not complicated.

In addition, the DBR may be generally manufactured by a physical vapor deposition (PVD) method. Due to the nature of the PVD method, the step coverage of the DBR becomes poor. However, in general, in order for the DBR to perform its function, the DBR must have a desired thickness. Therefore, the light reflecting ability of the DBR having poor step coverage may be degraded. However, according to the embodiment, since the metal reflecting layer 140 used in place of the DBR has good step coverage, the reflection ability of the metal reflecting layer 140 is not degraded. For example, the metal reflecting layer 140 may be manufactured by a sputtering method so that the step coverage of the metal reflecting layer 140 is good. As a result, when the metal reflecting layer 140 is used as in the embodiment instead of the DBR, the restriction in the thickness may be solved.

Also, while the process for manufacturing the DBR takes a long time, the process for manufacturing the metal reflecting layer 140 may be performed in a relatively short time. Therefore, according to the embodiment, since the metal reflecting layer 140 is used in place of the DBR, the manufacturing process time may be shortened.

In addition, when the DBR is used, cracks or peeling may occur in the light emitting device package due to a difference of thermal expansion coefficients or the thermal stress of the thin films. However, according to the embodiment, since the metal reflecting layer 140 is used instead of the DBR, the problem of cracking or peeling may be solved.

In addition, when the metal reflecting layer 140 is not disposed, a very high electric field E1 is concentrated on the interface B between the second electrode 134 and the first-second insulating layer 152-2 by electrostatic discharge (ESD) etc., thereby destroying the light emitting device package. In contrast, referring to FIG. 3, in the case of the light emitting device package 200 according to the embodiment, the metal reflecting layer 140 is disposed to be electrically connected to the second electrode 134 to which the second conductive type carriers (for example, holes (+)) are supplied. Since the second conductive type carriers are present in the metal reflecting layer 140 as described above, first conductive type carriers (for example, electrons (−)) are driven to one side 152A of the first-second insulating layers 152-2 contacting the metal reflecting layer 140. Therefore, the second conductive type carriers (for example, holes (+))

are driven to the other side 152B of the first-first insulating layer 152-1 which is the opposite side of the first-second insulating layer 152-2. Therefore, the first conductive type carriers (for example, electrons (−)) are driven into the second conductive semiconductor layer 126 that is in contact with the other side 152B of the first-first insulating layer 152-1.

As a result, a potential difference is caused in the second-first segment S21 of the metal reflecting layer 140 as shown so that the peak potential (or the peak electric field) is suppressed (i.e., shielding effect). Therefore, the electric field E may be reduced to the second electric field E2 which is lower than the first electric field E1 of the case that the metal reflecting layer 140 is not present. In this way, the metal reflecting layer 140 may play the role of preventing the light emitting device package 200 from being broken.

In addition, silver (Ag) is a substance having very high heat conductivity among metals. In considering that, when the metal reflecting layer 140 is formed of a material having high heat conductivity such as silver and the surface area of the metal reflecting layer 140 is widened, the thermal resistance of the light emitting device package 200 decreases, thereby improving thermal release characteristics.

In the light emitting device package according to the embodiment, an array of a plurality of light emitting device packages may be disposed on a board, and optical members such as a light guide plate, a prism sheet, and a diffuser sheet may be disposed in an optical path of the light emitting device packages. The light emitting device packages, the board, and the optical members may function as a backlight unit.

In addition, the light emitting device package according to the embodiment may be applied to a display apparatus, an indicator apparatus, and a lighting apparatus.

Here, the display apparatus may include a bottom cover, a reflective plate disposed on the bottom cover, a light emitting module configured to emit light, a light guide plate disposed in front of the reflective plate to forwardly guide light emitted from the light emitting module, optical sheets including prism sheets disposed in front of the light guide plate, a display panel disposed in front of the optical sheets, an image signal output circuit connected to the display panel to supply an image signal to the display panel, and a color filter disposed in front of the display panel. Here, the bottom cover, the reflective plate, the light emitting module, the light guide plate, and the optical sheets may constitute a backlight unit.

In addition, the lighting apparatus may include a light source module which includes a board and the light emitting device package according to the embodiment, a radiator configured to radiate heat of the light source module, and a power supply unit configured to process or convert an electrical signal from an external source so as to supply the same to the light source module. For example, the lighting apparatus may include a lamp, a headlamp, or a streetlight.

The headlamp may include a light emitting module which includes the light emitting device packages arranged on a board, a reflector configured to reflect light, emitted from the light source module, in a given direction, for example, forwardly, a lens configured to forwardly refract light reflected by the reflector, and a shade configured to achieve a light distribution pattern selected by a designer by blocking or reflecting some of light, reflected by the reflector and directed to the lens.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Various embodiments have been described in the best mode for carrying out the invention.

The light emitting device and the light emitting device package including the device according to the embodiment may be not broken at a high electric field by serving the metal reflecting layer as a field plate and applied to the display apparatus, the indicator apparatus, and the lighting apparatus having the improved thermal release characteristics.

What is claimed is:
1. A light emitting device comprising:
a sapphire substrate;
a light emitting structure disposed on the sapphire substrate;
a first electrode and a second electrode electrically connected to the light emitting structure;
a first insulation layer disposed on the light emitting structure;
a second insulation layer disposed on the first insulation layer; and
a first bonding pad and a second bonding pad disposed on the first insulation layer,
wherein the light emitting structure includes a first conductivity type semiconductor layer, and a light emitting member disposed on the first conductivity type semiconductor layer,
wherein the light emitting member includes an active layer and a second conductivity type semiconductor layer,
wherein the first electrode is electrically connected to the first conductivity type semiconductor layer,
wherein the second electrode is electrically connected to the second conductivity type semiconductor layer,
wherein the first bonding pad is electrically connected to the first electrode,
wherein the second bonding pad is electrically connected to the second electrode,
wherein the second electrode includes a contact layer that contacts the second conductivity type semiconductor layer, and an extending layer that is disposed on the contact layer,
wherein the extending layer of the second electrode extends to an upper surface of the first insulation layer from an upper surface of the contact layer,
wherein the second insulation layer includes a first portion that contacts an upper surface of the extending layer, a second portion that contacts an upper surface of the first insulation layer, and a third portion that contacts an upper surface of the first electrode,
wherein the extending layer of the second electrode is not directly contacting the second conductivity type semiconductor layer,
wherein the first insulation layer includes an overlapped portion that is overlapped with a portion of the extending layer, and a portion of the contact layer vertically, and wherein the overlapped portion of the first insulation layer directly contacts an upper surface of the contact layer and a lower surface of the extending layer.

2. The light emitting device of claim 1, wherein the first insulation layer includes a first layer and a second layer, and
wherein the first layer and the second layer of the first insulation layer include a different material.

3. The light emitting device of claim 2, wherein a thickness of the second layer is greater than a thickness of the first layer.

4. The light emitting device of claim 1, wherein the first insulation layer includes a first material,
wherein the second insulation layer includes a second material, and
wherein the first material is different from the second material.

5. The light emitting device of claim 4, wherein the first material includes a $SiO_2$ material, and
wherein the second material includes a $Si_3N_4$ material.

6. The light emitting device of claim 1, wherein a first height between an uppermost surface of the first bonding pad and an uppermost surface of the light emitting member is the same as a second height between an uppermost surface of the second bonding pad and the uppermost surface of the light emitting member.

7. The light emitting device of claim 6, wherein the second portion of the second insulation layer is closer to the light emitting member than the first portion of the second insulation layer.

8. The light emitting device of claim 1, wherein the first electrode overlaps the second electrode vertically.

9. The light emitting device of claim 8, wherein the first electrode overlaps the extending layer of the second electrode vertically.

10. The light emitting device of claim 8, wherein the second bonding pad overlaps the overlapped portion of the first insulation layer.

11. The light emitting device of claim 1, wherein the extending layer includes a stepped portion between an uppermost surface of the extending layer and a lower surface of the extending layer.

12. The light emitting device of claim 11, wherein the overlapped portion of the first insulation layer contacts the extending layer.

13. A light emitting device package, comprising:
a sapphire substrate;
a light emitting structure disposed on the sapphire substrate;
a first electrode and a second electrode electrically connected to the light emitting structure;
a first bonding pad electrically connected to the first electrode;
a second bonding pad electrically connected to the second electrode;
a first insulation layer disposed on the light emitting structure;
a second insulation layer disposed on the first insulation layer; and
a phosphor disposed on a lower surface of the sapphire substrate,
wherein the light emitting structure includes a first conductivity type semiconductor layer and a light emitting member disposed on the first conductivity type semiconductor layer,
wherein the light emitting member includes an active layer and a second conductivity type semiconductor layer,
wherein the second electrode includes a contact layer and an extending layer disposed on the contact layer,
wherein the extending layer of the second electrode extends on the first insulation layer,
wherein the second insulation layer includes a first portion that contacts an upper surface of the extending layer, a second portion that contacts an upper surface of the first insulation layer, and a third portion that contacts an upper surface of the first electrode,
wherein the extending layer of the second electrode is not directly contacting the second conductivity type semiconductor layer,
wherein the first insulation layer includes an overlapped portion that is overlapped with a portion of the extending layer, and a portion of the contact layer vertically, and
wherein the overlapped portion of the first insulation layer directly contacts an upper surface of the contact layer and a lower surface of the extending layer.

14. The light emitting device package of claim 13, wherein the first insulation layer includes a first material,
wherein the second insulation layer includes a second material, and
wherein the first material is the same as the second material.

15. The light emitting device package of claim 13, wherein the first insulation layer includes a first material,
wherein the second insulation layer includes a second material, and
wherein the first material is different from the second material.

16. The light emitting device package of claim 15, wherein the first material includes a $SiO_2$ material, and
wherein the second material includes a $Si_3N_4$ material.

17. The light emitting device package of claim 13, wherein the first insulation layer includes a first thickness, and the second insulation layer includes a second thickness,
wherein the first thickness is greater than the second thickness, and
wherein a first height between an uppermost surface of the first bonding pad and an uppermost surface of the light emitting member is the same as a second height between an uppermost surface of the second bonding pad and the uppermost surface of the light emitting member.

18. The light emitting device package of claim 17, wherein the first insulation layer extends on the light emitting member from the first conductivity type semiconductor layer.

19. The light emitting device package of claim 17, wherein the extending layer contacts the first insulation layer.

20. The light emitting device package of claim 17, wherein the phosphor is disposed on the lower surface of the sapphire substrate, and a side surface of the sapphire substrate.

* * * * *